(12) United States Patent
Inomata et al.

(10) Patent No.: US 7,755,929 B2
(45) Date of Patent: Jul. 13, 2010

(54) SPIN-INJECTION DEVICE AND MAGNETIC DEVICE USING SPIN-INJECTION DEVICE

(75) Inventors: Kouichiro Inomata, Miyagi (JP); Sadamichi Maekawa, Miyagi (JP); Saburo Takahashi, Miyagi (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 864 days.

(21) Appl. No.: 10/536,437

(22) PCT Filed: Nov. 20, 2003

(86) PCT No.: PCT/JP03/14830
§ 371 (c)(1),
(2), (4) Date: May 26, 2005

(87) PCT Pub. No.: WO2004/051754
PCT Pub. Date: Jun. 17, 2004

(65) Prior Publication Data
US 2006/0022220 A1 Feb. 2, 2006

(30) Foreign Application Priority Data
Nov. 29, 2002 (JP) .............................. 2002-349262

(51) Int. Cl.
*G11C 11/02* (2006.01)
*G11B 5/39* (2006.01)
*G11B 5/127* (2006.01)

(52) U.S. Cl. .................. 365/158; 365/173; 257/40; 257/295; 360/324; 360/324.12; 428/811.2; 428/811.5; 428/816

(58) Field of Classification Search .................. None
See application file for complete search history.

(56) References Cited

U.S. PATENT DOCUMENTS
5,728,481 A 3/1998 Kasai et al.
(Continued)

FOREIGN PATENT DOCUMENTS
JP 08-249875 A 9/1996
(Continued)

OTHER PUBLICATIONS
Schmidt, G., Ferrand, D., Molenkamp, L., Filip, A., and van Wees, B., Phys. Rev. B, v62(8), 2000, R4790-R4793.*
(Continued)

*Primary Examiner*—Kevin M Bernatz
(74) *Attorney, Agent, or Firm*—Westerman, Hattori, Daniels & Adrian, LLP

(57) ABSTRACT

First and second tunnel junctions having a common electrode composed of a nonmagnetic conductor and each of which has a counterelectrode composed of a ferromagnet are spaced apart from each other by a distance that is shorter than a spin diffusion length of the nonmagnetic conductor. The first tunnel junction injects spin from the ferromagnet into the nonmagnetic conductor and the second tunnel junction detects, between the ferromagnetic metal and the nonmagnetic conductor, a voltage that accompanies spin injection of the first tunnel junction. The nonmagnetic conductor may be a semiconductor or semimetal that is lower in carrier density than a metal. The common electrode alternatively may be composed of a superconductor. A spin injection device thus provided can exhibit a large signal voltage with a low current and under low magnetic field and can be miniaturized in device size.

13 Claims, 6 Drawing Sheets

U.S. PATENT DOCUMENTS

| | | | |
|---|---|---|---|
| 5,910,662 A * | 6/1999 | Itozaki et al. | 257/33 |
| 6,462,919 B1 * | 10/2002 | Mack et al. | 360/327.3 |
| 6,876,574 B2 * | 4/2005 | Giebeler et al. | 365/158 |
| 2002/0073785 A1 * | 6/2002 | Prakash et al. | 73/862.041 |

FOREIGN PATENT DOCUMENTS

| | | |
|---|---|---|
| JP | 11-204854 | 7/1999 |
| JP | 2000-113418 A | 4/2000 |
| JP | 2002-217472 | 8/2002 |
| JP | 2002-353533 | 12/2002 |
| JP | 2003-8102 | 1/2003 |
| JP | 2003-8105 | 1/2003 |
| JP | 2003-197875 | 7/2003 |
| JP | 2003-298023 | 10/2003 |

OTHER PUBLICATIONS

F. J. Jedema et al.; "Electrical detection of spin precession in a metallic mesoscopic spin valve", Nature, vol. 416, Apr. 18, 2002, pp. 713-716. Cited in the int'l. search report.

T. Miyazaki et al.; "Spin polarized tunneling in ferromagnet/insulator/ferromagnet junctions", Journal of Magnetismand Magnetic Materials, vol. 151, 1995, pp. 403-410. Cited in the specification.

M. Julliere, "Tunneling between ferromagnetic films", Physics Letters, vol. 54A, No. 3, Sep. 8, 1975, pp. 225-226. Cited in the specification.

M. Johnson et al.; "Interfacial Charge-Spin Coupling: Injection and Detection of Spin Magnetization in Metals", Physical Review Letters, vol. 55, No. 17, Oct. 21, 1985, pp. 1790-1793. Cited in the specification.

M. Johnson, "Spin Accumulation in Gold Films", Physical Review Letters, vol. 70, No. 14, Apr. 5, 1993, pp. 2142-2145. Cited in the specification.

F. J. Jedema et al., Electrical spin injection and accumulation at room temperature in all metal mesoscopic spin valve, NATURE, Mar. 15, 2001, vol. 410, pp. 345-348.

* cited by examiner

SPIN-INJECTION DEVICE AND MAGNETIC DEVICE USING SPIN-INJECTION DEVICE

TECHNICAL FIELD

The present invention relates to a spin injection device and a magnetic apparatus using the same.

BACKGROUND ART

The magnetoresistance effect that when an external magnetic field is applied to a metal or semiconductor, a change is produced in its resistivity has been utilized in magnetic heads and sensors. To obtain larger magnetoresistance, a magnetoresistance device using a tunnel junction is available, of which the ferromagnetic spin tunnel junction (MTJ) device and the spin injection device have drawn attention. In recent years, the attention has been focused on a magnetoresistance device using the tunnel junction as a new magnetic sensor or a new memory device for a magnetic random access memory (MRAM).

The conventional MTJ device has a ferromagnetic spin tunnel junction made of a layered structure having a ferromagnetic, an insulating and a ferromagnetic layer deposited in this order. When an external magnetic field is applied to control magnetizations of the two ferromagnetic layers to be oriented parallel or antiparallel to each other, the effect that the tunneling current flown in the two directions perpendicular to the film face differ in magnitude from each other, namely the "tunnel magnetoresistance (TMR) effect" as it is called, is obtained at a room temperature (See: T. Miyazaki et al., "Spin polarized tunneling in ferromagnet/insulator/ferromagnet junctions", 1995, J. Magn. Mater., Springer, Vol. 151, p. 403). The TMR in such a tunnel junction is known to depend on spin polarizability P at an interface between a ferromagnet and an insulator. Assuming the spin polarizabilities of the two ferromagnets to be $P_1$ and $P_2$, then in general TMR can be given by the equation (1) below (See: M. Julliere, "Tunneling between ferromagnetic films", 1975, Phys. Lett., Vol. 54A, p. 225).

$$TMR = 2P_1 P_2 / (1 - P_1 P_2) \quad (1)$$

where the spin polarizability P of a ferromagnetic layer has a value in $0 < P \leq 1$.

The maximum value of TMR that has currently been obtained at a room temperature in a MTJ device is about 50% of that when a CoFe alloy having a spin polarizability of about 0.5 is used. MTJ devices are expectedly applicable to readout heads for hard disk and MRAMs. When applied to a MRAM, MTJ devices are arrayed in the form of a matrix. Digits 1, 0 are recorded when two magnetic layers constituting a given MTJ device are magnetized either parallel or antiparallel to each other under magnetic fields imposed thereto by flowing electric currents in separately provided another interconnection.

On the other hand, it is known that when the current flows from a ferromagnet to a nonmagnetic metal, if the length of nonmagnetic metal is enough shorter than that of its spin diffusion length, then spins accumulate in the nonmagnetic metal, namely known as "spin accumulation". Thus, the flowing current from a ferromagnet to a nonmagnetic metal to this effect is called "spin injection". It was reported that this is due to the fact that in general a ferromagnet has a different spin density (up-spin and down-spin electrons are varied in number) at its Fermi level and this causes the chemical potential difference between up-spin and down-spin electrons when spin polarized electrons are injected by flowing current from the ferromagnet to the nonmagnetic metal (see: M. Johnson et al., "Interfacial Charge-Spin Coupling: Injection and Detection of Spin Magnetism in Metal", 1985, Phys. Rev. Lett., American Physical Society, Vol. 55, p. 1790).

In a ferromagnet/nonmagnetic metal system in which such spin injection occurs, disposing a second ferromagnet in contact with the nonmagnetic metal if having spins accumulated therein causes a voltage to be induced between the nonmagnetic metal and the second ferromagnet. It was reported that the polarity of the voltage can be inverted either positive or negative when magnetizations of the first and second ferromagnets are controlled to be either parallel or antiparallel to each other (see: M. Johnson et al, "Spin Accumulation", 1993, Phys. Rev. Lett., American Physical Society, Vol. 70, p. 2142).

A spin injection device has been proposed as a tunnel magnetoresistance device using the spin injection mentioned above (see: F. E. Jedema et al, "Electrical detection of spin precession in a metallic mesoscopic spin valve", 2002, Nature, Vol. 416, p. 713). FIGS. 5 and 6 illustrate the structure and operating principles of a conventional spin injection device in a cross sectional and a plan view thereof, respectively. As shown in FIG. 5 the conventional spin injection device, designated by reference character 50, comprises a first and a second tunnel junction 51 and 52 for injecting spins and for detecting a voltage due to a spin current, respectively. The first and second tunnel junctions 51 and 52 are spaced apart from each other by a distance L4 that is shorter than a spin diffusion length Ls and is formed on a nonmagnetic metal 53 that serves as a common electrode. The first tunnel junction 51 is constructed of an insulator 54 and a first ferromagnet 55 successively layered on the non-magnetic metal 53 while the second tunnel junction 52 is constructed of an insulator 54 and a second ferromagnet 56 successively layered on the nonmagnetic metal 53. A DC (direct current) source 58 applies a voltage across the first tunnel junction 51. Its positive and negative terminals are connected to the nonmagnetic metal 53 and ferromagnet 55, respectively. The flowing current in the first tunnel junction 51 is designated as I. On the other hand, a voltmeter 59 is connected between the ferromagnet 56 and the nonmagnetic metal 53 in the second tunnel junction 52 for voltage detection.

FIG. 6 is a plan view of essentially what FIG. 5 shows. Here, the spin injection device 50 is shown disposed on a substrate 57. It is also shown that an external magnetic field 60 is applied parallel to the plane of the substrate 57. This applied external magnetic field 60 produces magnetizations 61 and 62 in the ferromagnet 55 of the first tunnel junction 51 and in the ferromagnet 56 of the second tunnel junction 52, respectively. As indicated, patterns shown of the first tunnel junction 51, the second tunnel junction 52 and the nonmagnetic metal 53 have long sides L1, L2 and L3, respectively, and their short sides are W1, W2 and W3, respectively.

Mention is next made of an operation of the conventional spin injection device constructed as described above. In the spin injection device 50, a voltage is applied from the DC source 58 to the first tunnel junction 51 to effect the spin injection by tunneling electrons. A spin current (Is in FIG. 5) by the spin injection flows through a closed circuit to which are connected the voltmeter 59 and the second tunnel junction 52 that is spaced by distance L4 shorter than the spin diffusion length. A voltage induced thereby is detected by the voltmeter 59 connected between the ferromagnet 56 and the nonmagnetic metal 53 in the second tunnel junction 52.

Here, the voltage detection is made easy, since a sign of the induced voltage can be changed by controlling direction of the external magnetic field 60 so that the magnetizations 62 and 63 of the ferromagnets 55 and 56 used in the tunnel junctions 51 and 52 are oriented either parallel or antiparallel to each other. For this reason, the second conventional spin injection device is found promising as a magnetoresistance device using a tunnel junction that is immune to noises.

In the conventional spin injection device, the output resistance Rs for detection can be measured according to the equation below.

$$R_s = (V_{AP} - V_P)/I_s = V_s/I_s \quad (2)$$

where $V_{AP}$ and $V_P$ represent induced voltages when the magnetizations of the ferromagnets 55 and 56 are antiparallel and parallel to each other, respectively. With $V_S = V_{AP} - V_P$, Is represents the current flowing through the second tunnel junction 52.

In the conventional spin injection device in which the nonmagnetic metal 53 as the common electrode has small resistance, the problem arises that the detected output resistance is as small as 10 mΩ and fails to provide a practically sufficient signal voltage. Further, in the layered structure of the conventional spin injection device, it is required that the sizes of the first and second tunnel junctions 51 and 52 should be varied each other, since there is the need to invert the magnetization 61 of the ferromagnet 55 in the first tunnel junction 51 at the spin injection side and to fix the magnetization of the ferromagnet 56 in the second tunnel junction 52 at the other. For this reason, the aspect ratio (length/width) of the ferromagnet 56 in the second tunnel junction 52 needs to be larger than that in the first tunnel junction 51.

Also in the conventional spin junction device 50, the distance L4 between the first and second tunnel junctions 51 and 52 must be smaller than the spin diffusion length $\lambda_N$, where $\lambda_N$ is generally 1 μm or less. Therefore, the ferromagnet 55, 56 that forms the tunnel junction must be 1 μm or less and further be a submicron or less in size. Since a ferromagnet thus reduced in size increases its demagnetizing field when placed in an external magnetic field, there is increased magnetic switching field that is the magnitude of an external magnetic filed needed for magnetic switching. Thus, the conventional spin injection device has the problem that the magnetic switching field increases when reduced in size. And it can not be operated under the low magnetic field.

Further, in the utilization of conventional spin injection device as memory cells for MRAM, there is a requirement that its device size is made as small as possible to increase their storage capacity. However, the size reduction of the ferromagnet 55, 56 increases magnetic switching field in the conventional spin injection device 50 as mentioned above. This requires that a large current should be flown with a wire separately provided in the MRAM to generate sufficient external field, thus incurring an increase of power consumption. On the other hand, it is necessary to increase the surface area of ferromagnet 51 to some extent in the first tunnel junction 51 for spin injection in order to reduce the power consumption in the field generating wires, permitting flux reversal at low magnetic field in the first tunnel junction 51 for spin injection requires increasing the surface area of its ferromagnet 51 to some extent. Thus, in an attempt to use the conventional spin injection devices 50, e.g., as memory cells in the MRAM, there is the tradeoff relationship between the reducing the magnetic switching field and decreasing the device area in size. Consequently, there has been the problem that limitations are brought about in increasing the storage capacity, e.g., from the fact that reducing magnetic switching field requires increasing the device area in a tunnel junction.

DISCLOSURE OF THE INVENTION

In view of the above problems, it is an object of the present invention to provide a spin injection device which exhibits a larger resistance change with spin injection under a low magnetic field, can produce a larger signal voltage, and has small device size that permits low magnetic switching field under a low magnetic field. Another object of the present invention is to provide a magnetic apparatus using such a spin injection device.

The present inventors conducted theoretical studies on spin accumulation in nonmagnetic metal in a spin injection device and have succeeded in making the present invention based upon the discovery that if any of semiconductor, semimetal and superconductor is chosen and used for the nonmagnetic metal in a spin injection device, the spin injection device exhibits an output resistance $R_s$ derived from spin accumulation which is markedly larger than that obtainable if metal was used to form it as in the conventional spin injection device.

In order to achieve the objects mentioned above, therefore, there is provided in accordance with the present invention a spin injection device characterized in that it comprises a first and a second tunnel junction which have a common electrode composed of a nonmagnetic conductor and each of which has a counterelectrode composed of a ferromagnet, wherein the first tunnel junction is a tunnel junction having an insulator interposed between the nonmagnetic conductor and the ferromagnet; the second tunnel junction is a tunnel junction in which an insulator, the ferromagnet and an antiferromagnet are successively layered on the nonmagnetic conductor, the antiferromagnet acting to fix spins of the ferromagnet, or the second tunnel junction is a tunnel junction in which an insulator, a ferromagnet, a nonmagnetic metal and the ferromagnet are successively layered on the nonmagnetic conductor, the ferromagnets at opposite sides of the nonmagnetic metal being magnetically coupled together antiparallel to each other view the nonmagnetic metal; the first and second tunnel junctions are disposed spaced apart from each other by a distance that is shorter than a spin diffusion length of the nonmagnetic conductor; the first tunnel junction is a tunnel junction for spin injection therein from the ferromagnetic metal into the nonmagnetic conductor; the second tunnel junction is a tunnel junction for detection between the ferromagnetic metal and the nonmagnetic conductor therein of a voltage accompanying the spin injection; and the nonmagnetic conductor is a nonmagnetic conductor that is lower in carrier density than a metal. Here, the nonmagnetic conductor is preferably a semiconductor, and it may also be preferred that the nonmagnetic conductor be a semimetal. Also, the first tunnel junction is preferably of a tunnel junction structure in which an insulator, a feromagnet, a nonmagnetic metal and the ferromagnet are successively layered on the nonmagnetic conductor and the ferromagnets at both sides of the nonmagnetic metal are magnetically coupled together antiparallel to each other via the nonmagnetic metal.

The present invention also provides a spin injection device characterized in that it comprises a first and a second tunnel junction which have a common electrode composed of a superconductor and each of which has a counterelectrode composed of a ferromagnet, wherein the first and second tunnel junctions are disposed spaced apart from each other by a distance that is shorter than a spin diffusion length of the superconductor, the first tunnel junction is a tunnel junction for spin injection therein from the ferromagnetic metal into the superconductor, and the second tunnel junction is a tunnel junction for detection between the ferromagnetic metal and the superconductor therein of a voltage accompanying the spin injection. The first and second tunnel junctions may each be a tunnel junction having an insulator interposed between the nonmagnetic conductor or superconductor and the ferromagnet.

Also, at least one of the first and second tunnel junctions may specifically be of a tunnel junction structure in which an insulator, a ferromagnet, a nonmagnetic metal and a ferromagnet are successively layered on the nonmagnetic conductor or on the superconductor wherein the ferromagnets at both sides of the nonmagnetic metal are magnetically coupled together antiparallel to each other via the nonmagnetic metal. The ferromagnets that are magnetically coupled together antiparallel to each other via said nonmagnetic metal are each in the form of a film in which aspect ratio is preferably 1. In the second tunnel junction for voltage detection, the layer of the ferromagnet preferably has an antiferromagnet disposed thereon for fixing spins of the ferromagnet. Also, the spin injection device may be formed on a substrate.

So constructed as mentioned above, according to the present invention, the spin injection device, which uses any one of a semiconductor, a semimetal and a superconductor that is smaller in carrier density than a nonmagnetic metal, can provide an markedly larger output resistance Rs derived from spin accumulation than that of the conventional spin injection device which is made of metal as the nonmagnetic conductor. Further, it can provide a large signal voltage by virtue of a large resistance change accompanied in the spin injection with low current and under low magnetic field. Furthermore, a spin injection device can be provided that can be miniaturized in its size while permitting low magnetic switching field even under low magnetic field.

The present invention also provides a magnetic apparatus characterized in that it has a spin injection device constructed as mentioned above. So constructed, a magnetic apparatus such as a high sensitive magnetic field sensor or a magnetic head or a large storage capacity MRAM with high output voltage is attained by virtue of the fact that a spin injection device of the present invention provides a large output resistance $R_s$ under low magnetic field and with low current and can be miniaturized in device size.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTION

Hereinafter, forms of implementations of a spin injection device and a magnetic apparatus using the same according to the present invention will be described in detail with reference to the accompanying drawings.

Figure 1:
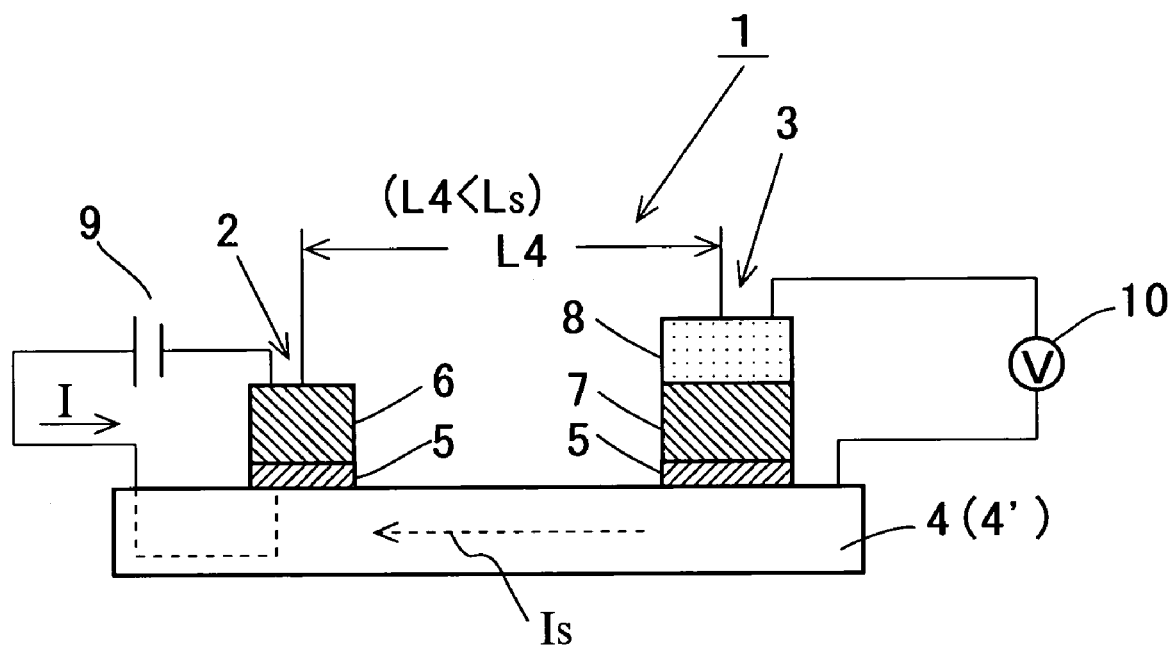
FIG. 1 is a cross sectional view illustrating the structure and operation principles of a spin injection device according to the present invention.

FIG. 1 is a cross sectional view illustrating the structure and operation principles of a spin injection device 1 according to the present invention. The spin injection device 1 according to the present invention comprises a first tunnel junction 2 for spin injection and a second tunnel junction 3 for detecting a voltage by spin current, which are disposed on a nonmagnetic conductor 4 or a superconductor 4' and spaced apart from each other by a distance L4 that is shorter than spin diffusion length Ls.

The first tunnel junction 2 has a structure in which an insulator 5 and a first ferromagnet 6 are successively layered on the nonmagnetic conductor 4 or the superconductor 4' while the second tunnel junction 3 has a structure in which an insulator 5, a second ferromagnet 7 and an antiferromagnet 8 are successively layered on the nonmagnetic conductor 4 or the superconductor 4'.

A DC (direct current) source 9 applies a positive voltage to the nonmagnetic conductor 4 or the superconductor 4' and a negative voltage to the ferromagnet 6 in the first tunnel junction 2. The current through the first tunnel junction 2 is designated as I. On the other hand, a voltmeter 10 is connected between the antiferromagnet 8 and the nonmagnetic conductor 4 or the superconductor 4' in the second tunnel junction 3 for voltage detection.

Here, the nonmagnetic conductor 4 is either a semiconductor or a semimetal. By the way, in the following description the term "nonmagnetic conductor 4" will be used, unless otherwise indicated, to mean both the nonmagnetic conductor 4 and superconductor 4' interchangeably.

Figure 2:
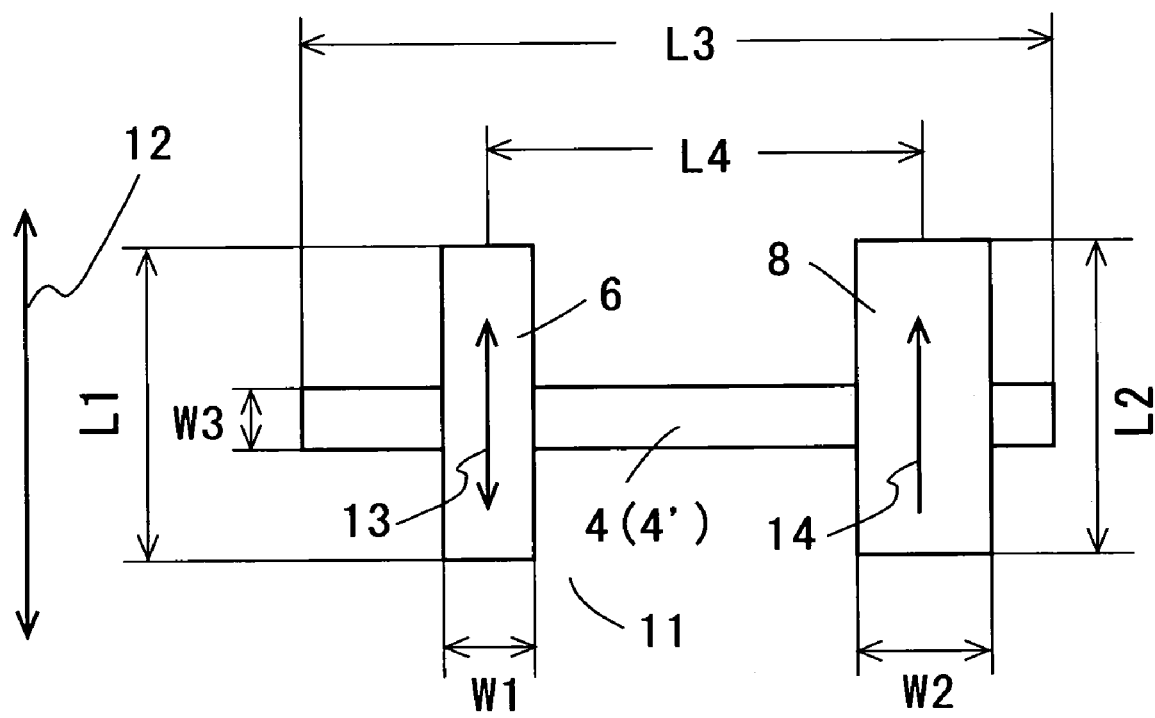
FIG. 2 is a plan view illustrating the spin injection device shown in FIG. 1.

FIG. 2 is a plan view corresponding to FIG. 1 and shows the spin injection device 1 of the present invention as being disposed on a substrate 11 covered with an insulator. And, an external magnetic field 12 is applied parallel to a plane of the substrate 11. With the external magnetic field 12 applied, it is shown that magnetizations 13 and 14 are produced in the ferromagnets 6 and 8 in the first and second tunnel junctions, respectively. As indicated, patterns shown of the first tunnel junction 2, the second tunnel junction 3 and the nonmagnetic conductor 4 have long sides L1, L2 and L3, respectively. And their short sides are W1, W2 and W3, respectively.

Now then, the present invention differs from the conventional spin junction device 50 in that the common electrode for the two tunnel junctions 2 and 3 is not of a nonmagnetic metal but of either a nonmagnetic conductor 4 or a superconductor 4' and that the second tunnel junction 3 on the detection side has a further an antiferromagnet 8 layered on the ferromagnet 7.

At the outset, reasons why the semiconductor or a semimetal for nonmagnetic conductor 4 should be used is mentioned. The present inventors carried out theoretical calculations on the spin injection device and, based thereon, have found out that when the nonmagnetic conductor 4 is an electrical conductor such as semiconductor or semimetal, the output resistance $R_s$ derived from spin accumulation is given by equation (3) below.

$$R_s = P_j^2 R_N \exp(-L_4/\lambda_N) \tag{3}$$

where $P_j$ is the spin polarizability of ferromagnets 6 and 7 forming the tunnel junctions (here, it is assumed that the ferromagnets 6 and 7 are identical to each other in constituent material), $R_N$ is the resistance of the nonmagnetic conductor 4, L4 is the distance between the first and second tunnel junctions 2 and 3, and $\lambda_N$ is the spin diffusion length of the nonmagnetic conductor 4.

From equation (3), it is seen that given the spin polarizability of the ferromagnets 6 and 7, the output resistance $R_s$ due to the spin accumulation can be made large when the resistance $R_N$ of the nonmagnetic conductor 4 is large and $L_4$ is smaller than $\lambda_N$. Thus, using a semiconductor or semimetal to form the nonmagnetic conductor 4 here allows increasing the output resistance $R_s$ due to spin accumulation, since the semiconductor or semimetal has smaller carrier density and has a larger resistivity than that of usual metal which has been used to form the nonmagnetic metal 53 of a conventional spin injection device 50.

It has further been found out that if a superconductor 4' is used for the common electrode, the output resistance Rs' resulting from spin accumulation is given by equations (4) and (5) below.

$$R_s' = P_j^2 R_N \exp(-L/\lambda_N')/2f_0(\Delta) \tag{4}$$

$$f_0(\Delta) = 1/[\exp(\Delta/k_B T) + 1] \tag{5}$$

where $R_N$ is the resistance of the superconductor 4', $\lambda_N'$ is the spin diffusion length of the superconductor, $f_0(\Delta)$ is an equation relating to energy gap $\Delta$ of the superconductor 4', $k_B$ is the Boltzmann's constant and T is the absolute temperature (K).

When $\Delta$ is 0, $f_0(\Delta)$ no longer stands for the superconductor 4'. Then, with $f_0(\Delta)=\frac{1}{2}$, equation (4) becomes identical to the equation (3). Since $f_0(\Delta)$ is smaller than ½ for an ordinary superconductor 4', it is seen from equations (4) and (5) that using a superconductor 4' which is smaller in carrier density and larger in resistivity than an ordinary metal allows the output resistance $R_s$ derived from spin accumulation to increase. Also, the larger $\Delta$, the larger can its value be.

From the above it is apparent that in a spin injection device of the present invention, spins are easier to accumulate in its nonmagnetic conductor 4 that is a semiconductor, semimetal or superconductor than in the nonmagnetic metal 53 that is an ordinary metal in the conventional spin injection 50 and as a result the output resistance $R_s$ can be increased.

Next, the reason why an antiferromagnet 8 should be disposed further on the ferromagnet 7 in the second tunnel junction 3 at the detection side will be explained. In the second tunnel junction 3, spins due to a magnetization 14 of the ferromagnet 7 can be fixed in one direction by the valve effect in the exchange interaction between a ferromagnet 7 and an antiferromagnet 8. This makes it unnecessary that as in the conventional spin injection device 50 the aspect ratio (length by width) of the ferromagnetic layer 56 of the second tunnel junction 52 be larger than that of the first tunnel junction 51 and can reduce the device size.

Next another form of implementation of the spin injection device according to the present invention will be described.

Figure 3:
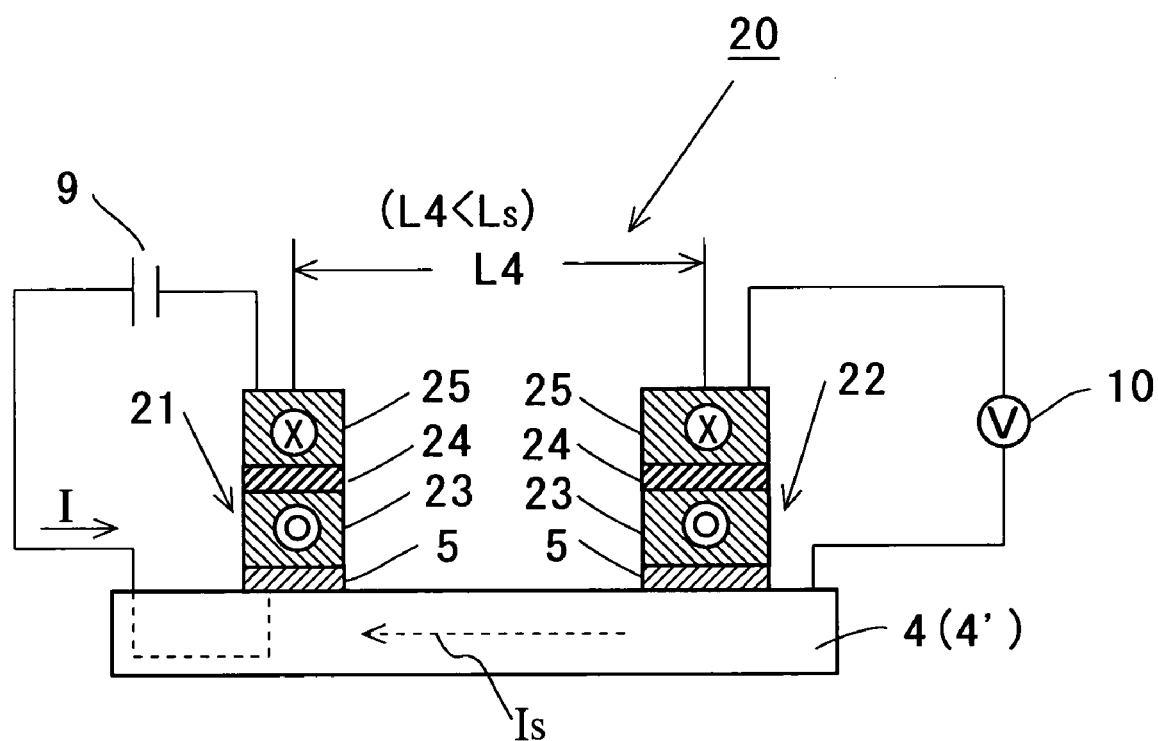
FIG. 3 is a cross sectional view illustrating the structure and operation principles of a spin injection device as another form of implementation of the present invention.

FIG. 3 is a cross sectional view illustrating the structure and operation principles of a spin injection device 20 as another form of implementation of the present invention. The spin injection device 20 in this form of implementation of the present invention comprises a first tunnel junction 21 for spin injection and a second tunnel junction 22 for detecting a voltage by spin current, which are disposed on a nonmagnetic conductor 4 or a superconductor 4' and spaced apart from each other by a distance L4 that is shorter than its spin diffusion length Ls.

The spin injection device 20 in this form of the present invention differs from the spin injection device 1 shown in FIG. 1 in that each of the first and second tunnel junctions 21 and 22 is so made that an insulator 5, a first ferromagnet 23, a nonmagnetic metal 24 and a second ferromagnet 25 are successively layered on the nonmagnetic conductor 4 or superconductor 4'. In each of the first and second tunnel junctions 21 and 22, the two ferromagnetic layers 23 and 25 at opposite sides of the nonmagnetic metal 24 are magnetically coupled antiparallel to each other as shown. A corresponding plan view to include the other components that have been described is not shown to save repeated description.

Mention is next made of a modification of the spin injection device 20 in this form of implementation of the present invention.

Figure 4:
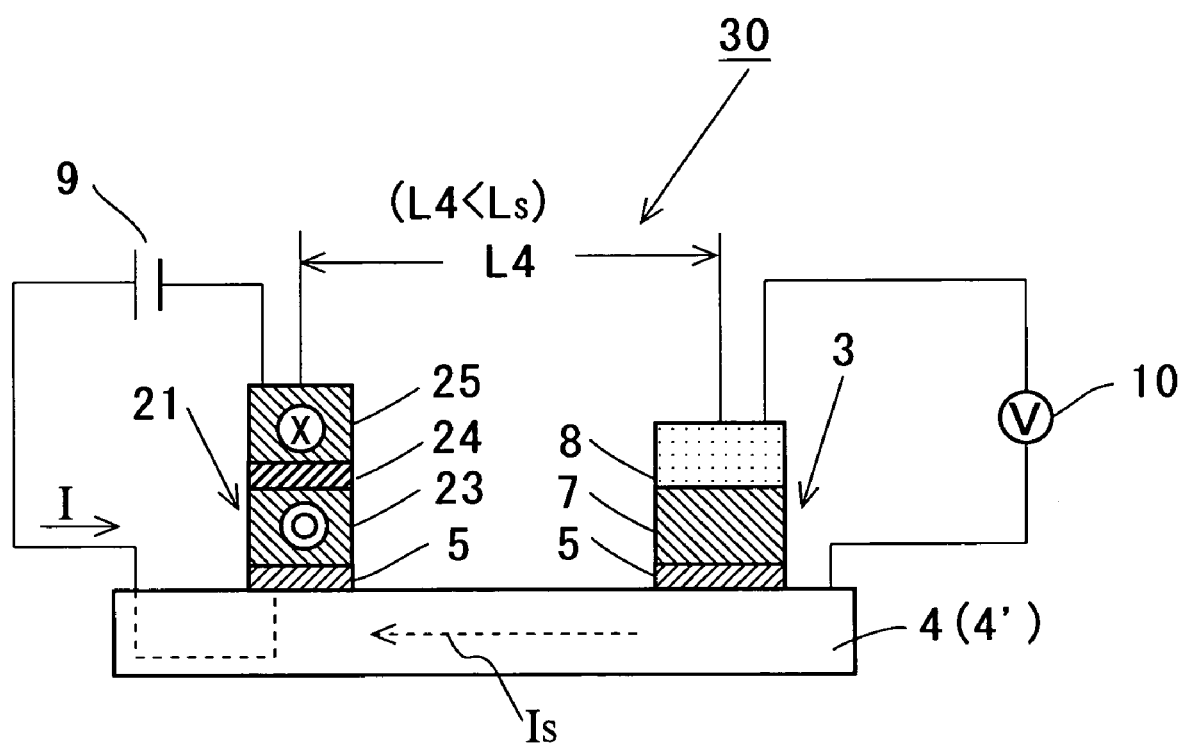
FIG. 4 is a cross sectional view illustrating the structure and operation principles of a spin injection device as a modified form of implementation of the present invention.
Figure 5:
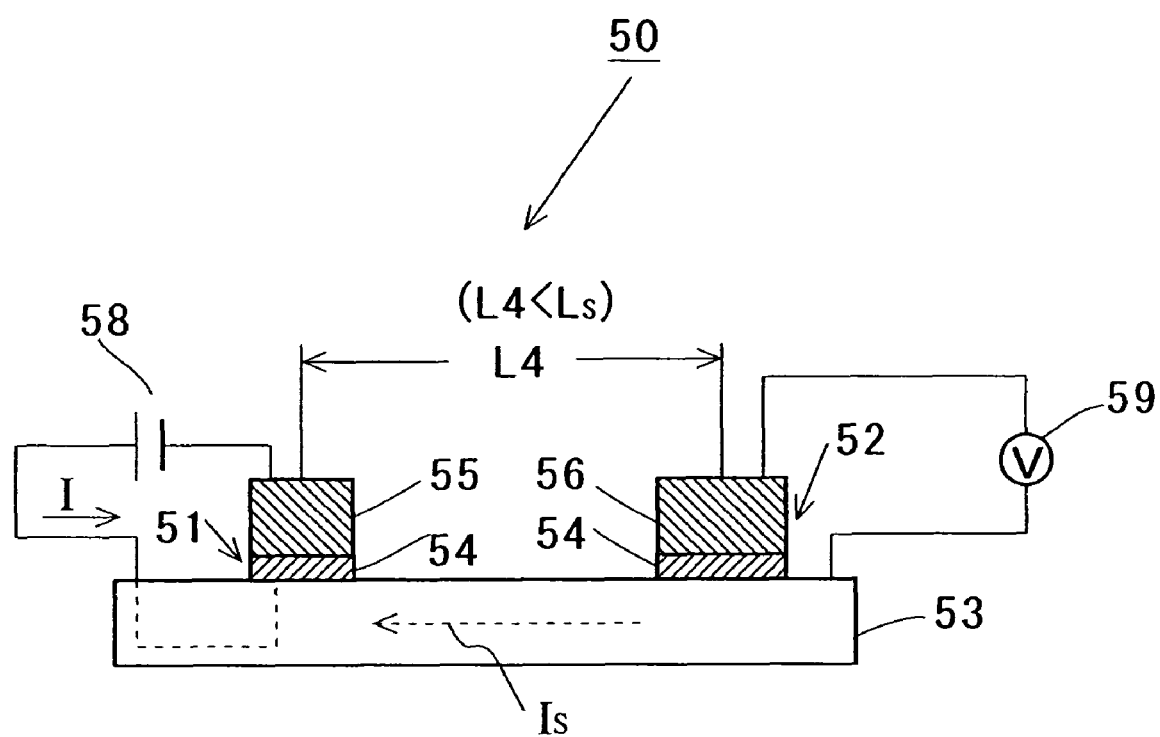
FIG. 5 is a cross sectional view illustrating the structure and operation principles of a spin injection device according to the prior art.
Figure 6:
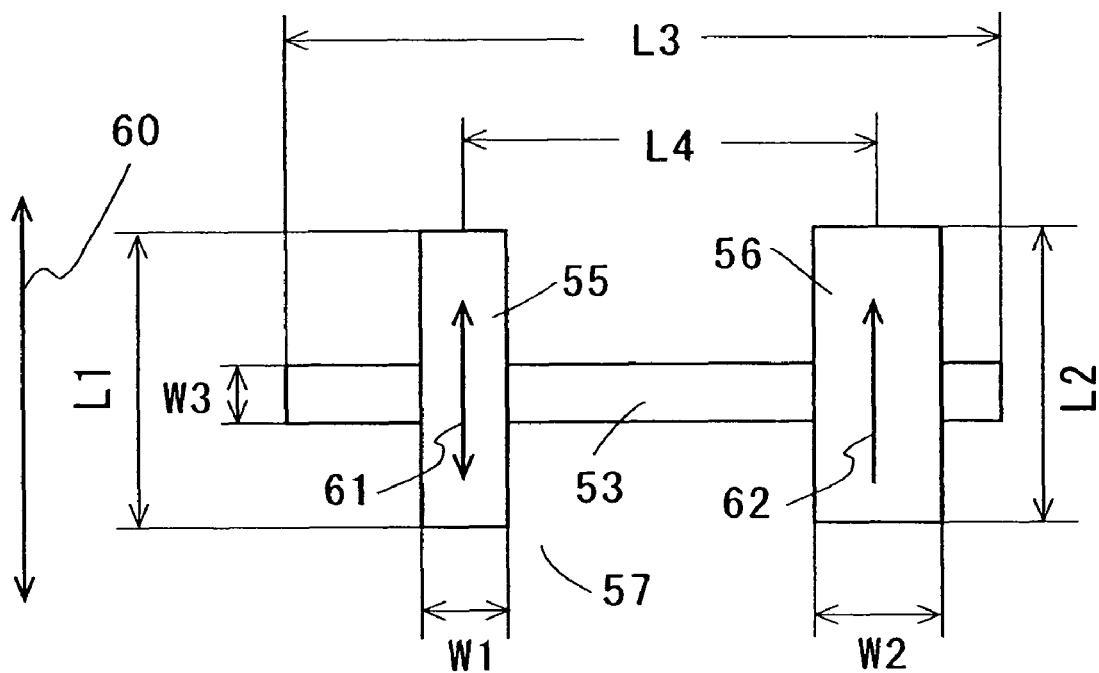
FIG. 6 is a plan view illustrating the spin injection device as shown in FIG. 5.

FIG. 4 is a cross sectional view illustrating the structure and operation principles of a spin injection device as such a modified form of implementation of the present invention. The spin injection device 30 of the present invention comprises a first tunnel junction 21 for spin injection as shown in FIG. 3 and a second tunnel junction 3 for detecting a voltage by spin current as shown in FIG. 1, which are disposed on a nonmagnetic conductor 4 or a superconductor 4' and spaced apart from each other by a distance L4 that is shorter than its spin diffusion length Ls. A corresponding plan view to include the other components that have been described is not shown to save repeated description.

Mention is next made of reasons why each of the spin injection devices 20 and 30 should be constructed as mentioned above so that at least one of the two tunnel junctions takes the form of the first tunnel junction 21 that uses the two ferromagnetic layers 23 and 25 magnetically coupled antiparallel across the nonmagnetic metal 24. If the two ferromagnets 23 and 25 magnetically coupled antiparallel across the nonmagnetic metal 24 are used in the first tunnel junction 21 for the spin injection device 20, 30, then the ferromagnets 23 and 25 act to produce a reduced demagnetizing field therein when an external magnetic field 12 is applied and can thus be magnetized more readily even when a low external magnetic field is applied.

Since this allows flux reversal in the first tunnel junction 21 under a low magnetic field and thus can reduce the flux reversal field therefor, the device size can be reduced. Especially, magnetic switching field can be extremely reduced when the antiparallel coupled layers having an aspect ratio of 1 are used that makes the demagnetizing factor to be zero. And the device thus even more reduced in size.

Next a magnetic apparatus as implemented to use a spin injection device of the present invention will be explained.

As shown in FIGS. 1 to 4, a spin injection device of the present invention exhibits an extremely large value of the output resistance $R_s$ derived from spin accumulation with low current and under low magnetic field. It can provide a high sensitive magnetic device as a magnetoresistance sensor, since a spin injection device of the present invention exhibits a large output resistance $R_s$ and provides a large output voltage with low current and under low magnetic field. Also, a spin injection device of the invention which exhibits a large output resistance with low current and under low magnetic field can provide a high output voltage and can constitute a high sensitive magnetic head as a readout magnetic apparatus.

Further, spin injection devices of the present invention can be disposed in the form of a matrix, too. Then, an external magnetic field can be applied to an individual one of the spin injection devices by flowing an electric current in a wire separately provided therefor to magnetize the ferromagnet in the first tunnel junction in the spin injection device. Depending on whether this ferromagnet is magnetized parallel or antiparallel, the second tunnel junction can have one of two states (1, 0), namely either the state that the voltage induced therein is positive or the state that it is negative, and this state can be retained, namely recorded. With individual ones of the spin injection devices so controlled in recording, a magnetic apparatus such as MRAM can be provided. Further, the ability of spin injection devices here to be made smaller in device size allows achieving a magnetic device such as MRAM rendered larger in storage capacity.

Mention is next made of specific examples of a spin injection device according to the present invention.

EXAMPLE 1

A spin injection device 1 (FIG. 1) that implements the present invention was made as follows. The GaAs film doped by Si (silicon) as an impurity was epitaxially grown to having a thickness of 100 nm onto a semi-insulating GaAs substrate 11 to form the nonmagnetic conductor 4 by using MBE (molecular beam epitaxy).

The Al film having a thickness 1.2 nm was deposited onto the GaAs thin film. This Al film was oxidized using plasma oxidation to form an Al oxide film as the insulator 5. Thereafter, Co was deposited to a film thickness of 3 nm to form the ferromagnet 7 onto the Al oxide film, and then IrMn was deposited to a film thickness of 10 nm to form the antiferromagnet 8.

The multilayered film mentioned above was miniaturized using electron beam lithography and Ar ion milling to fabricate a structure as typically shown in FIG. 1 in which the Si doped GaAs film serves as the nonmagnetic conductor 4 for two tunnel junctions 2 and 3. The Si doped GaAs film had a width W3 of 0.25 μm and a length L3 of 2 μm. The first and second tunnel junctions 2 and 3 had each a size of 0.5 μm×1.5 μm. The distance between the two tunnel junctions was variously varied as being 1 μm or less.

In the spin injection device 1 of the present invention so prepared, current I flows from Co via the Al oxide film to the Si doped GaAs film in the first tunnel junction 2 and voltage was measured between Co and the Si doped GaAs film in the second tunnel junction (see FIG. 1).

As shown in FIG. 2, an external magnetic field 12 was applied to produce magnetization 13 of Co in the first tunnel junction 2 and also reversed to reverse its magnetization 13. Voltages were thereby measured in the second tunnel junction when the two Co layers were magnetized parallel and antiparallel to each other, respectively, to find an output resistance $R_s$ from equation (2). When L4=0.2 μm, that $R_s$=1.5Ω was found. This output resistance $R_s$ value is seen to be about two orders of magnitudes larger than that with a conventional spin injection device 50 using an ordinary metal. By the way, the magnetic switching field for the Co film was a value of about 100 oersteds.

EXAMPLE 2

A spin injection device 1 (FIG. 1) that implements the present invention was made as follows. The substrate 11 was a Si substrate covered with a thermally oxidized film on which substrate a thin metal film of Nb (niobium) having a thickness of 100 nm was deposited using an ultrahigh vacuum sputtering apparatus to form the superconductor 4'. The Al was deposited to a film thickness of 1.5 nm onto the Nb thin film. This Al film was oxidized using plasma oxidation to form an Al oxide film as the insulator 5. Thereafter, $Co_{90}Fe_{10}$ alloy was deposited to a film thickness of 5 nm to form the ferromagnet 7 onto the Al oxide film, and then IrMn was deposited to a film thickness of 10 nm to form the antiferromagnet 8.

The multilayered film mentioned above was miniaturized using electron beam lithography and Ar ion milling to fabricate a structure as typically shown in FIG. 1 in which the Nb thin film serves as the nonmagnetic conductor 4 for two tunnel junctions 2 and 3. The Nb thin film had a width W3 of 0.25 μm and a length L3 of 2 μm. The first and second tunnel junctions 2 and 3 had each a size of 0.5 μm×1.5 μm. The distance L4 between the two tunnel junctions was variously varied as being 1 μm or less.

In the spin injection device 1 of the present invention so prepared, the current I flowed, at a temperature of 1.5 K, from the $Co_{90}Fe_{10}$ alloy film via the Al oxide film to the Nb thin film in the first tunnel junction 2 and voltage was measured between the $Co_{90}Fe_{10}$ alloy film and the Nb thin film in the second tunnel junction 3 (see FIG. 1).

As shown in FIG. 2, an external magnetic field 12 was applied to produce magnetization 13 of $Co_{90}Fe_{10}$ alloy film in the first tunnel junction 2 and also reversed to reverse its magnetization 13. Voltages were thereby measured when the two $Co_{90}Fe_{10}$ alloy films were magnetized parallel and antiparallel to each other, respectively, to find an output resistance $R_s$ from the equation (2). When L4=0.2 μm, that $R_s$≈20Ω was found. This value of output resistance $R_s$ is seen to be about three orders of magnitudes larger than that with a conventional spin injection device 50 using an ordinary metal. By the way, the external field required for the magnetic switching of the Co film had a value of about 100 oersteds.

EXAMPLE 3

A spin injection device 20 that implements the present invention was made as follows. This Example is the same as Example 2 except that in the first tunnel junction 2 the $Co_{90}Fe_{10}$ alloy film in Example 2 was replaced by a three layers film made of $Co_{90}Fe_{10}$ of 5 nm thick, Ru of 0.45 nm thick and $Co_{90}Fe_{10}$ of 3 nm thick. And, the spin injection device 20 prepared had ferromagnets 23 and 25 magnetically coupled antiparallel to each other via a nonmagnetic metal 24 in each of the first and second tunnel junctions 21 and 22 as shown in FIG. 3. In the course of this fabrication, it was confirmed that the two $Co_{90}Fe_{10}$ ferromagnets were magnetically coupled antiparallel to each other via Ru in the layered structure of $Co_{90}Fe_{10}$ (5 nm), Ru (0.45 nm) and $Co_{90}Fe_{10}$ (3 nm).

In the spin injection device 20 of the present invention so prepared, the current I flowed, at a temperature of 1.5 K, from the $Co_{90}Fe_{10}$ (5 nm)/Ru (0.45 nm)/$Co_{90}Fe_{10}$ (3 nm) film via the Al oxide film to the Nb thin film in the first tunnel junction 21 and voltage was measured between the layered $Co_{90}Fe_{10}$ (5 nm)/Ru (0.45 nm)/$Co_{90}Fe_{10}$ (3 nm) film and the Nb thin film in the second tunnel junction 22 (see FIG. 3).

An external magnetic field was applied to produce a magnetization of the $Co_{90}Fe_{10}$ (5 nm)/Ru (0.45 nm)/$Co_{90}Fe_{10}$ (3 nm) film in the first tunnel junction 21 and also reversed to reverse its magnetization. Voltages were thereby measured when the two $Co_{90}Fe_{10}$ alloy films, which contacted the Ru as a nonmagnetic metal 24, were magnetized parallel and antiparallel to each other, respectively, to find an output resistance $R_s$ from equation (2). When L4=0.2 μm, that $R_s$≈20Ω was found. This value of output resistance $R_s$ is seen to be about three orders of magnitudes larger than that with a conventional spin injection device 50 using an ordinary metal. Here, the magnetic switching field for reversing the magnetization 13 of the laminated $Co_{90}Fe_{10}$ (5 nm)/Ru (0.45 nm)/$Co_{90}Fe_{10}$ (3 nm) film while keeping the film antiparallel had a magnitude of about 30 oersteds. It is seen that this magnetic switching field is ⅓ smaller in magnitude than that of 100 oersteds in the Example 2 which $Co_{90}Fe_{10}$ (thickness 5 nm) film was used as the ferromagnet 6 in the first tunnel junction 2.

It should be understood that the invention is not intended to be limited to the specific examples thereof set forth above, but to include all possible modifications that can be made within the scope with respect to the features specifically set forth in the appended claims and to encompass all the equivalents thereof. For example, the nonmagnetic conductor has been shown to be a semiconductor but as a matter of course be a semimetal such as Bi or FeSi. Further, a magnetic apparatus to which a spin injection device of the present invention is applicable has been shown to be a magnetoresistance sensor, MRAM or magnetic head but may be any other magnetic apparatus to which it is equally applicable.

INDUSTRIAL APPLICABILITY

As will be appreciated from the foregoing description, a spin injection device of the present invention is capable of giving rise to an extremely large output resistance $R_s$ with low current and under low external magnetic field. Further, a spin injection device of the present invention as it is capable of giving rise to an extremely large output resistance $R_s$ can be made much smaller in size than a conventional spin injection device.

Furthermore, a spin injection device when it is applied to a magnetic device is capable of providing a novel magnetic apparatus. Thus, when this spin injection device is applied to a magnetic device, not only a high sensitive magnetic head or a MRAM with a large signal voltage but also a variety of high sensitive magnetic sensors can be realized.

What is claimed is:

1. A spin injection device comprising a first tunnel junction and a second tunnel junction which have a common electrode composed of a nonmagnetic conductor and each of which has a counterelectrode composed of a ferromagnet, wherein:
    said first tunnel junction is a tunnel junction having an insulator interposed between said nonmagnetic conductor and said ferromagnet;
    said second tunnel junction is a tunnel junction in which an insulator, a ferromagnet, a nonmagnetic metal and said ferromagnet are successively layered on said nonmagnetic conductor, the ferromagnets at opposite sides of said nonmagnetic metal being magnetically coupled together antiparallel to each other via said nonmagnetic metal;
    said first and second tunnel junctions are disposed spaced apart from each other by a distance that is shorter than a spin diffusion length of said nonmagnetic conductor;
    said first tunnel junction is a tunnel junction for spin injection therein from a current (I) flowing from said ferromagnetic metal in the first tunnel junction into said nonmagnetic conductor when a positive voltage is applied to said common electrode and a negative voltage is applied to said ferromagnet in the first tunnel junction and said first tunnel junction is a tunnel junction to flow spin current (Is) between said first tunnel junction and said second tunnel junction,
    said second tunnel junction is a tunnel junction for detection between said ferromagnetic metal in said second tunnel junction and said nonmagnetic conductor therein of a voltage accompanying the spin injection of said first tunnel junction, and
    said nonmagnetic conductor is a semiconductor, or a semimetal having lower carrier density than a nonmagnetic metal
    wherein an output resistance defined by an equation below detected at said second tunnel junction of the spin injection device is at least 1.5Ω, $Rs=(Vs)/Is$ where Vs is a voltage difference of the detected voltage of said second tunnel junction with magnetization reversal of said ferromagnet of said first tunnel junction by an applied external magnetic field, and Is represents said spin current between said first tunnel junction and said second tunnel junction.

2. A spin injection device as set forth in claim 1, characterized in that said first tunnel junction is of a tunnel junction structure in which an insulator, a ferromagnet, a nonmagnetic metal and said ferromagnet are successively layered on said nonmagnetic conductor and that said ferromagnets at both sides of said nonmagnetic metal are magnetically coupled together antiparallel to each other via said nonmagnetic metal.

3. A spin injection device as set forth in claim 2, characterized in that said ferromagnets magnetically coupled together antiparallel to each other via said nonmagnetic metal are each in the form of a film whose aspect ratio is 1.

4. A spin injection device as set forth in any one of claims 1, 2 and 3, characterized in that the spin injection device is formed on a substrate.

5. A magnetic apparatus, characterized in that it has a spin injection device as set forth in any one of claims 1, 2 and 3.

6. A spin injection device as set forth in claim 1, characterized in that said common electrode is of impurity doped GaAs.

7. A spin injection device comprising:
    a first tunnel junction and a second tunnel junction which have a common electrode composed of a superconductor and each of which has a counterelectrode composed of a ferromagnet, wherein:
    said first tunnel junction is a tunnel junction having an insulator interposed between said superconductor and said ferromagnet,
    said second tunnel junction is a tunnel junction having an insulator interposed between said superconductor and said ferromagnet,
    said first and second tunnel junctions are disposed spaced apart from each other by a distance that is shorter than a spin diffusion length of said superconductor;
    said first tunnel junction is a tunnel junction for spin injection therein from a current (I) flowing from said ferromagnetic metal in said first tunnel junction into said superconductor when a positive voltage is applied to said common electrode and a negative voltage is applied to said ferromagnet in the first tunnel junction and said first tunnel junction is a tunnel junction to flow spin current (Is) between said first tunnel junction and said second tunnel junction,
    said second tunnel junction is a tunnel junction for detection between said ferromagnetic metal in said second tunnel junction and said superconductor therein of a voltage accompanying the spin injection of said first tunnel junction, and
    at least one of said first and second tunnel junctions is of a tunnel junction structure in which an insulator, a ferromagnet, a nonmagnetic metal and a ferromagnet are successively layered on said nonmagnetic conductor and that said ferromagnets at both sides of said nonmagnetic metal are magnetically coupled together antiparallel to each other via said nonmagnetic metal
wherein an output resistance defined by an equation below detected at said second tunnel junction of the spin injection device is at least about 20Ω, $$Rs=(Vs)/Is$$

where Vs is a voltage difference of the detected voltage of said second tunnel junction with magnetization reversal of said ferromagnet of said first tunnel junction by an applied external magnetic field, and Is represents said spin current between said first tunnel junction and said second tunnel junction.

8. A spin injection device as set forth in claim 7, characterized in that said first and second tunnel junctions are each a tunnel junction having an insulator interposed between said superconductor and said ferromagnet.

9. A spin injection device as set forth in claim 7, characterized in that said ferromagnets magnetically coupled together antiparallel to each other via said nonmagnetic metal are each in the form of a film in which aspect ratio is 1.

10. A spin injection device as set forth in claim 7, characterized in that in said second tunnel junction for voltage detection, the layer of said ferromagnet has an antiferromagnet disposed thereon for fixing spins of said ferromagnet.

11. A spin injection device as set forth in any one of claims 7, 8, 9 and 10, characterized in that said spin injection device is formed on a substrate.

12. A magnetic apparatus, characterized in that it has a spin injection device as set forth in any one of claims 7, 8, 9 and 10.

13. A spin injection device as set forth in claim 7, characterized in that said common electrode is of Nb.

* * * * *